United States Patent
Yamamoto et al.

(10) Patent No.: US 11,588,468 B2
(45) Date of Patent: Feb. 21, 2023

(54) ACOUSTIC WAVE DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventors: Koji Yamamoto, Nagaokakyo (JP); Masatoshi Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 437 days.

(21) Appl. No.: 16/801,360

(22) Filed: Feb. 26, 2020

(65) Prior Publication Data

US 2020/0195219 A1 Jun. 18, 2020

Related U.S. Application Data

(63) Continuation of application No. PCT/JP2018/026354, filed on Jul. 12, 2018.

(30) Foreign Application Priority Data

Aug. 29, 2017 (JP) .............................. JP2017-164113

(51) Int. Cl.
*H03H 9/02* (2006.01)
*H03F 3/24* (2006.01)
(Continued)

(52) U.S. Cl.
CPC .......... *H03H 9/02897* (2013.01); *H03F 3/24* (2013.01); *H03H 9/02834* (2013.01);
(Continued)

(58) Field of Classification Search
CPC .......... H03H 9/02897; H03H 9/02834; H03H 9/02866; H03H 9/059; H03H 9/1092;
(Continued)

(56) References Cited

U.S. PATENT DOCUMENTS

| 2013/0271238 A1 | 10/2013 | Onda et al. |
| 2016/0277003 A1 | 9/2016 | Kikuchi et al. |

(Continued)

FOREIGN PATENT DOCUMENTS

| JP | 2007-036656 A | 2/2007 |
| JP | 2013-223025 A | 10/2013 |

(Continued)

OTHER PUBLICATIONS

Official Communication issued in International Patent Application No. PCT/JP2018/026354, dated Sep. 11, 2018.

*Primary Examiner* — Hafizur Rahman
(74) *Attorney, Agent, or Firm* — Keating & Bennett, LLP (57) ABSTRACT

An acoustic wave device includes a laminated film on a support substrate and inside a portion of an outer edge of the support substrate in plan view and including a piezoelectric thin film, an IDT electrode on the laminated film, an insulating layer on the support substrate and the laminated film and extending from a region above the support substrate to a region above the laminated film, a connecting electrode on the insulating layer and electrically connected to the IDT electrode, and an external connection terminal electrically connected to the connecting electrode and disposed directly on or above the connecting electrode and outside a region where the laminated film is on the support substrate. A principal surface of the support substrate on the laminated film side includes a recess at an outer edge of the laminated film, and the recess is covered with the insulating layer.

19 Claims, 8 Drawing Sheets

(51) Int. Cl.
*H03H 9/05* (2006.01)
*H03H 9/10* (2006.01)
*H03H 9/145* (2006.01)
*H03H 9/25* (2006.01)
*H04B 1/40* (2015.01)

(52) U.S. Cl.
CPC ........ *H03H 9/02866* (2013.01); *H03H 9/059* (2013.01); *H03H 9/1092* (2013.01); *H03H 9/145* (2013.01); *H03H 9/25* (2013.01); *H04B 1/40* (2013.01); *H03F 2200/171* (2013.01); *H03F 2200/451* (2013.01)

(58) Field of Classification Search
CPC .. H03H 9/145; H03H 9/25; H03F 3/24; H03F 2200/171; H03F 2200/451; H04B 1/40
USPC ...................................................... 310/313 C
See application file for complete search history.

(56) References Cited

U.S. PATENT DOCUMENTS

| | | |
|---|---|---|
| 2016/0380611 A1 | 12/2016 | Kai |
| 2018/0097502 A1 | 4/2018 | Yamamoto et al. |
| 2018/0158801 A1* | 6/2018 | Takano ................... H01L 24/81 |

FOREIGN PATENT DOCUMENTS

| | | |
|---|---|---|
| JP | 2017-011681 A | 1/2017 |
| WO | 2015/098678 A1 | 7/2015 |
| WO | 2016/208428 A1 | 12/2016 |

* cited by examiner

ACOUSTIC WAVE DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-164113 filed on Aug. 29, 2017 and is a Continuation Application of PCT Application No. PCT/JP2018/026354 filed on Jul. 12, 2018. The entire contents of each application are hereby incorporated herein by reference.

BACKGROUND OF THE INVENTION

1. Field of the Invention

The present invention relates to an acoustic wave device, a radio-frequency front-end circuit, and a communication apparatus.

2. Description of the Related Art

The acoustic wave device has widely been used as a component, such as a filter, in a cellular phone. International Publication No. WO 2016/208428 discloses an example of an acoustic wave device. This acoustic wave device includes a support substrate, a laminated film that is disposed on the support substrate and that includes a piezoelectric thin film, an interdigital transducer (IDT) electrode disposed on the laminated film, an insulating layer that is disposed on the support substrate and on the laminated film and that extends from a region above the support substrate to a region above the laminated film, a wiring electrode that is disposed on the insulating layer and that is electrically connected to the IDT electrode, and an external connection terminal electrically connected to the wiring electrode. According to International Publication No. WO 2016/208428, a stress caused by bonding the external connection terminal is not directly applied to the laminated film, and the laminated film including the piezoelectric thin film is unlikely to crack or chip because the external connection terminal is disposed in a region where no laminated film is present in plan view.

In the acoustic wave device described in International Publication No. WO 2016/208428, stress is applied to the interface between the laminated film and the support substrate, for example, when the acoustic wave device is heated. This is because the laminated film and the support substrate have different thermal expansion coefficients. In particular, the stress tends to be concentrated in a portion where an outer edge of the laminated film touches the support substrate. Thus, the laminated film is likely to crack or chip, or the laminated film is likely to separate from the support substrate.

SUMMARY OF THE INVENTION

Preferred embodiments of the present invention provide acoustic wave devices, radio-frequency front-end circuits, and communication apparatuses in each of which a laminated film is unlikely to crack or chip, and a support substrate and the laminated film are unlikely to separate from each other.

An acoustic wave device according to a preferred embodiment of the present invention includes a support substrate, a laminated film, an interdigital transducer (IDT) electrode, an insulating layer, a connecting electrode, and an external connection terminal. The laminated film is disposed on the support substrate and inside at least a portion of an outer edge of the support substrate in plan view and includes a piezoelectric thin film. The IDT electrode is disposed on the laminated film. The insulating layer is disposed on the support substrate and on the laminated film and extends from a region above the support substrate to a region above the laminated film. The connecting electrode is disposed on the insulating layer and electrically connected to the IDT electrode. The external connection terminal is electrically connected to the connecting electrode and is disposed directly on or indirectly above the connecting electrode and in plan view outside a region where the laminated film is disposed on the support substrate. A principal surface of the support substrate on the laminated film side includes a recess at an outer edge of the laminated film in plan view, and the recess is covered with the insulating layer.

In an acoustic wave device according to a preferred embodiment of the present invention, a coefficient of linear expansion of the laminated film and a coefficient of linear expansion of the support substrate differ from each other.

In an acoustic wave device according to a preferred embodiment of the present invention, the recess is provided in an entire or substantially an entire region outside the region where the laminated film is disposed on the support substrate in plan view. In this case, the support substrate and the laminated film are less likely to separate from each other.

In an acoustic wave device according to a preferred embodiment of the present invention, the recess surrounds the laminated film. In this case, the support substrate and the laminated film are less likely to separate from each other.

In an acoustic wave device according to a preferred embodiment of the present invention, the support substrate is made of material in which a bulk wave propagates at a higher acoustic velocity than an acoustic velocity of an acoustic wave that propagates in the piezoelectric thin film, the laminated film includes a low-acoustic-velocity film in which a bulk wave propagates at a lower acoustic velocity than the acoustic velocity of the acoustic wave that propagates in the piezoelectric thin film, and the piezoelectric thin film is disposed on the low-acoustic-velocity film. In this case, the energy of the acoustic wave is able to be efficiently confined.

In an acoustic wave device according to a preferred embodiment of the present invention, the laminated film includes a high-acoustic-velocity film in which a bulk wave propagates at a higher acoustic velocity than an acoustic velocity of an acoustic wave that propagates in the piezoelectric thin film and a low-acoustic-velocity film in which a bulk wave propagates at a lower acoustic velocity than the acoustic velocity of the acoustic wave that propagates in the piezoelectric thin film, the low-acoustic-velocity film is disposed on the high-acoustic-velocity film, and the piezoelectric thin film is disposed on the low-acoustic-velocity film. In this case, the energy of the acoustic wave is able to be efficiently confined.

In an acoustic wave device according to a preferred embodiment of the present invention, the laminated film includes an acoustic reflective layer that includes a high-acoustic-impedance film having an acoustic impedance that is relatively high and a low-acoustic-impedance film having a lower acoustic impedance than the acoustic impedance of the high-acoustic-impedance film, and the piezoelectric thin film is disposed on the acoustic reflective layer. In this case, the energy of the acoustic wave is able to be efficiently confined.

In an acoustic wave device according to a preferred embodiment of the present invention, a support that includes an opening surrounding the IDT electrode and that is disposed directly on or indirectly above the support substrate and in plan view in a region outside the region where the laminated film is disposed on the support substrate, a cover that is disposed on the support so as to cover the opening, and an under-bump metal layer that penetrates the support and the cover so as to be connected to the connecting electrode are further included, the external connection terminal is a bump disposed indirectly above the connecting electrode with the under-bump metal layer interposed between the connecting electrode and the external connection terminal, and the IDT electrode is disposed inside a hollow space enclosed by the support substrate, the support, and the cover.

In an acoustic wave device according to a preferred embodiment of the present invention, the external connection terminal is a bump disposed directly on the connecting electrode.

A radio-frequency front-end circuit according to a preferred embodiment of the present invention includes an acoustic wave device according to a preferred embodiment of the present invention and a power amplifier.

A communication apparatus according to a preferred embodiment of the present invention includes a radio-frequency front-end circuit according to a preferred embodiment of the present invention and a radio-frequency signal processing circuit.

According to preferred embodiments of the present invention, acoustic wave devices, radio-frequency front-end circuits, and communication apparatuses in each of which a laminated film is unlikely to crack or chip and a support substrate and the laminated film is unlikely to separate from each other are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings.

It is to be noted that the preferred embodiments are described in the specification for illustrative purposes and that partial substitutions or combinations of configurations in different preferred embodiments are feasible.

Figure 1:
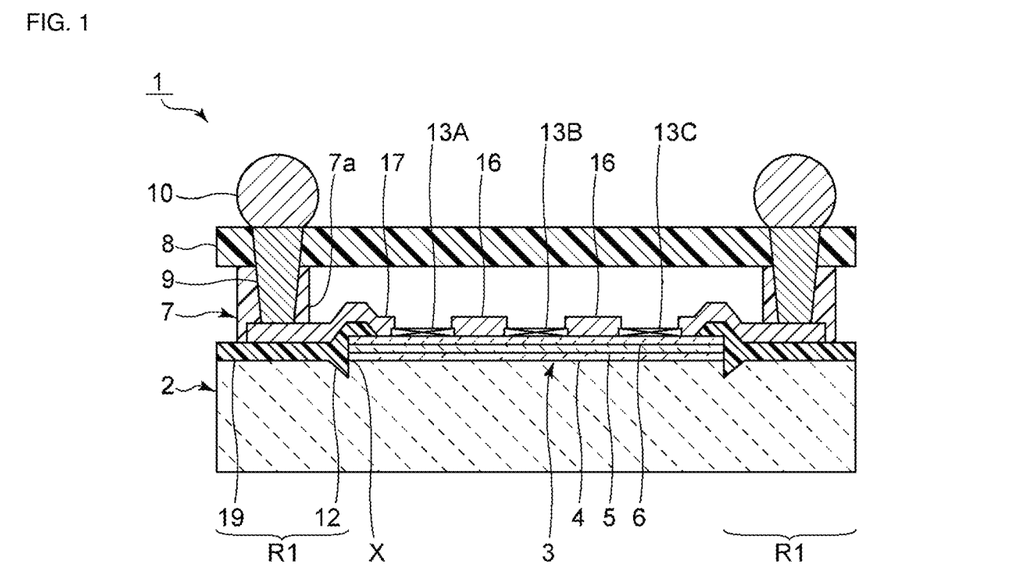
FIG. 1 is a schematic cross-sectional view of an acoustic wave device according to a first preferred embodiment of the present invention.
Figure 2:
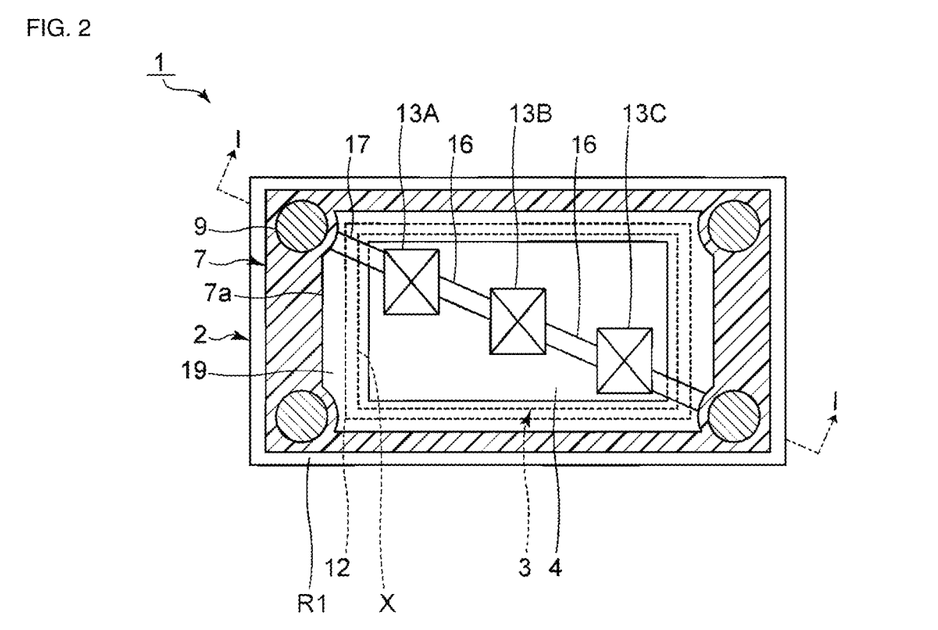
FIG. 2 is a schematic horizontal cross-sectional view of the acoustic wave device according to the first preferred embodiment of the present invention.

FIG. 1 is a schematic cross-sectional view of an acoustic wave device according to a first preferred embodiment of the present invention. FIG. 2 is a schematic horizontal cross-sectional view of the acoustic wave device according to the first preferred embodiment. FIG. 1 is a cross-sectional view taken along line I-I of FIG. 2. Acoustic wave resonators in FIGS. 1 and 2 are represented by simplified figures each having a rectangular shape with two diagonals.

An acoustic wave device 1 includes a support substrate 2 as shown in FIGS. 1 and 2. The support substrate 2 is made of appropriate material, such as glass or Si, for example.

A laminated film 3 including a piezoelectric thin film 6 is disposed on the support substrate 2. Specifically, the laminated film 3 is disposed inside at least a portion of the outer edge of the support substrate 2 in plan view. In this specification, a plan view means viewing the acoustic wave device 1 in the thickness direction of the support substrate 2 from the principal surface side of the support substrate 2, the principal surface being on the side on which the laminated film 3 is disposed. As shown in FIG. 1, the laminated film 3 includes a high-acoustic-velocity film 4 and a low-acoustic-velocity film 5 in addition to the piezoelectric thin film 6. More specifically, the high-acoustic-velocity film 4 is disposed on the support substrate 2, the low-acoustic-velocity film 5 is disposed on the high-acoustic-velocity film 4, and the piezoelectric thin film 6 is disposed on the low-acoustic-velocity film 5.

In the present preferred embodiment, the piezoelectric thin film 6 is preferably made of piezoelectric single crystal, such as $LiNbO_3$ or $LiTaO_3$, for example. The piezoelectric thin film 6 may be made of appropriate piezoelectric ceramics.

The high-acoustic-velocity film 4 is a film in which a bulk wave propagates at a higher acoustic velocity than the acoustic velocity of an acoustic wave that propagates in the piezoelectric thin film 6. The high-acoustic-velocity film 4 is preferably made of material mainly including, for example, aluminum nitride, aluminum oxide, silicon carbide, silicon oxynitride, silicon, diamond-like carbon (DLC), or diamond. The high-acoustic-velocity film 4 may be made of material having a high acoustic velocity in relative terms.

The low-acoustic-velocity film 5 is a film in which a bulk wave propagates at a lower acoustic velocity than the acoustic velocity of an acoustic wave that propagates in the piezoelectric thin film 6. The low-acoustic-velocity film 5 is preferably made of material mainly including, for example, glass, silicon oxynitride, tantalum oxide, or a compound formed by adding fluorine, carbon, or boron to silicon oxide. The low-acoustic-velocity film may be made of material having a low acoustic velocity in relative terms.

Since the acoustic wave device 1 includes the laminated film 3, in which the high-acoustic-velocity film 4, the low-acoustic-velocity film 5, and the piezoelectric thin film 6 are laminated together, the acoustic wave device 1 can efficiently confine the energy of an acoustic wave. The low-acoustic-velocity film 5 may optionally be omitted. The laminated film 3 may include films other than the above films.

Acoustic wave resonators 13A, 13B, and 13C are provided on the piezoelectric thin film 6.

Figure 3:
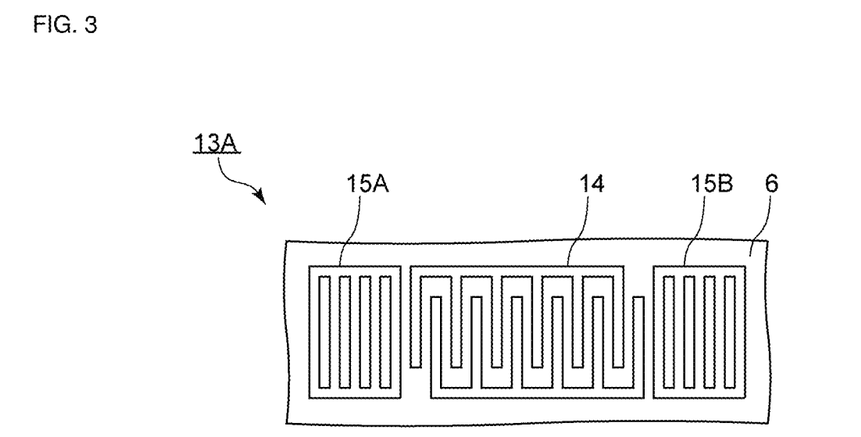
FIG. 3 is a schematic enlarged plan view showing an acoustic wave resonator and vicinity in the first preferred embodiment of the present invention.

FIG. 3 is a schematic enlarged plan view showing an acoustic wave resonator and vicinity in the first preferred embodiment. Wiring around the acoustic wave resonator is not shown.

An interdigital transducer (IDT) electrode 14 is disposed on the piezoelectric thin film 6. An alternating current voltage applied to the IDT electrode 14 excites an acoustic wave. Reflectors 15A and 15B are disposed on opposite ends of the IDT electrode 14 in the propagation direction of the acoustic wave. The acoustic wave resonator 13A is configured in this way. The acoustic wave resonators 13B and 13C shown in FIG. 1 are configured similarly. The acoustic wave resonators 13A, 13B, and 13C are electrically connected to each other by using a plurality of wiring electrodes 16. The number of acoustic wave resonators and the connecting configuration in the acoustic wave device 1 are not particularly limited.

The IDT electrode 14 may be disposed indirectly above the piezoelectric thin film 6. For example, the laminated film 3 may preferably include a silicon oxide film on the piezoelectric thin film 6. In this case, the IDT electrode 14 is disposed directly on the silicon oxide film. Namely, the IDT electrode 14 may be disposed on the laminated film 3.

The support substrate 2 includes a removal region R1 in which the laminated film 3 is partially removed, the removal region R1 being located in plan view in a region outside the region where the IDT electrodes are disposed.

Figure 4:
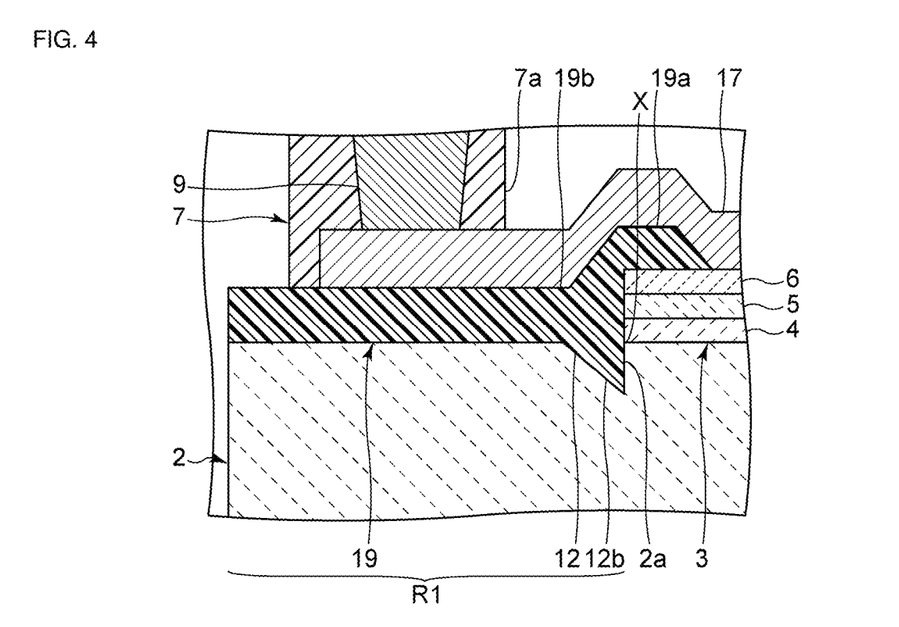
FIG. 4 is an enlarged illustration showing a removal region of a support substrate and vicinity in FIG. 1 in the first preferred embodiment of the present invention.

FIG. 4 is an enlarged illustration showing a removal region R1 of the support substrate 2 and vicinity in FIG. 1 in the first preferred embodiment.

The acoustic wave device 1 according to the present preferred embodiment includes an insulating layer 19 that is disposed in the removal region R1 of the support substrate 2 and that extends to a region above the piezoelectric thin film 6. The insulating layer 19 includes a first portion 19a disposed on the piezoelectric thin film 6 and a second portion 19b located in the removal region R1. Examples of materials of which the insulating layer 19 is made preferably include, but are not particularly limited to, for example, organic insulators including polyimide, epoxy resin, and acrylic resin and inorganic insulators including silicon oxide.

The support substrate 2 includes an outer-edge contact portion X located on the edge of a portion in contact with the laminated film 3. A recess 12 is provided in the removal region R1 of the support substrate 2 so as to be in contact with the outer-edge contact portion X. The recess 12 includes a connecting portion 2a that connects the outer-edge contact portion X to a lower portion in the removal region R1. The lower portion in the removal region R1 defines the bottom of the recess 12 in the present preferred embodiment, and the connecting portion 2a is connected to the lower portion in the removal region R1. Thus, the recess 12 includes a portion of the removal region R1, and the portion defines a lower portion in direct contact with the outer-edge contact portion X. The recess 12 includes the entire or substantially the entire connecting portion 2a in the acoustic wave device 1. The connecting portion 2a is one of the surfaces inside the recess 12.

The recess 12 may be formed, for example, by etching the support substrate 2 after forming a resist layer on the laminated film 3 and forming a resist layer in a portion where the recess 12 is not to be formed in the removal region R1.

As shown in FIG. 2, the recess 12 surrounds the laminated film 3. In this way, the connecting portion 2a is in contact with the entire or substantially the entire outer-edge contact portion X. The recess 12 need not surround the laminated film 3, and the connecting portion 2a may be in contact with at least a portion of the outer-edge contact portion X.

Referring back to FIG. 4, the recess 12 includes an inner surface 12b that is inclined with respect to the thickness direction of the support substrate 2 and that is connected to the connecting portion 2a. The insulating layer 19 extends to the outer-edge contact portion X and to the inside of the recess 12. The configuration of the recess 12 is not limited to the above configuration and, for example, the recess 12 may include one or more surfaces that are neither the connecting portion 2a nor the inner surface 12b. The bottom of the recess 12 is where the connecting portion 2a and the inner surface 12b are connected to each other in the acoustic wave device 1. However, for example, a portion where a surface other than the connecting portion 2a is connected to the inner surface 12b may define the bottom.

In the present preferred embodiment, the portion other than the portion where the recess 12 is provided in the removal region R1 of the support substrate 2 has the same or substantially the same height as the portion in contact with the laminated film 3. The height in the present specification means a position in the direction parallel or substantially parallel to the thickness direction of the support substrate 2. The support substrate 2 is located lower than the piezoelectric thin film 6.

The acoustic wave device 1 includes a connecting electrode 17 connected to the acoustic wave resonator 13A shown in FIG. 1. As shown in FIG. 4, the connecting electrode 17 extends from a region above the piezoelectric thin film 6 to a region above the first portion 19a of the insulating layer 19 and further to a region above the second portion 19b.

The connecting electrode 17 extends to the removal region R1 of the support substrate 2. The connecting electrode 17 is disposed indirectly above the support substrate 2 with the insulating layer 19 interposed therebetween. The connecting electrode 17 may be disposed directly on the support substrate 2. However, if the support substrate 2 is made of material having a low electrical resistivity, the connecting electrode 17 is preferably disposed on the insulating layer 19. This configuration is unlikely to degrade electrical characteristics of the acoustic wave device 1.

As shown in FIG. 1, a support 7 is disposed in the removal region R1 of the support substrate 2. The support 7 includes an opening 7a surrounding the acoustic wave resonators 13A, 13B, and 13C. The support 7 is disposed so covers a portion of the connecting electrode 17. The support 7 is preferably made of appropriate resin.

A cover 8 is disposed on the support 7 to cover the opening 7a. An under-bump metal layer 9 penetrates the support 7 and the cover 8. The surface of the under-bump metal layer 9 on the piezoelectric thin film 6 side is in contact with the connecting electrode 17. A bump 10 is disposed as an external connection terminal on the under-bump metal layer 9. In the present preferred embodiment, the bump 10 is disposed indirectly above the connecting electrode 17 with the under-bump metal layer 9 interposed therebetween. The bump 10 is disposed in plan view outside a region where the laminated film 3 is disposed on the support substrate 2. The external connection terminal is not limited to a bump and may be a member electrically connecting the acoustic wave device 1 to outside. For example, the external connection terminal may include an under-bump metal layer in addition to a bump.

The acoustic wave resonators 13A, 13B, and 13C are disposed inside a hollow space enclosed by the support substrate 2, the support 7, and the cover 8. The acoustic wave resonators 13A, 13B, and 13C are electrically connected to outside by the connecting electrode 17, the under-bump metal layer 9, and the bump 10.

In this way, the acoustic wave device 1 has a wafer level package (WLP) structure. The acoustic wave device 1 is not limited to the above structure and may be an acoustic wave device included, for example, in a chip size package (CSP) structure.

Features of the present preferred embodiment include the acoustic wave device 1 that includes the support substrate 2, the laminated film 3, the IDT electrode 14, the insulating layer 19, the connecting electrode 17, and the external connection terminal. The laminated film 3 is disposed on the support substrate 2 and inside at least a portion of an outer edge of the support substrate 2 in plan view and includes the piezoelectric thin film 6. The IDT electrode 14 is disposed on the laminated film 3. The insulating layer 19 is disposed on the support substrate 2 and on the laminated film 3 and extends from a region above the support substrate 2 to a region above the laminated film 3. The connecting electrode 17 is disposed on the insulating layer 19 and electrically connected to the IDT electrode 14. The external connection terminal is electrically connected to the connecting electrode 17 and is disposed directly on or indirectly above the connecting electrode 17 and in plan view outside a region where the laminated film 3 is disposed on the support substrate 2. In the acoustic wave device 1, a principal surface of the support substrate 2 on the laminated film 3 side includes the recess 12 at an outer edge of the laminated film 3 in plan view, and the recess 12 is covered with the insulating layer 19.

In this way, the principal surface of the support substrate 2 on the laminated film 3 side includes the recess 12 at the outer edge of the laminated film 3 in plan view, and the recess 12 is covered with the insulating layer 19. Thus, for example, if thermal stress is applied to the support substrate 2 and the laminated film 3 whose coefficients of linear expansion differ from each other, the thermal stress is relaxed at or near the outer-edge contact portion X, where the applied thermal stress is highest, and the support substrate 2 and the laminated film 3 are unlikely to separate from each other. This is because the region that is located inside the recess 12 and at or near the outer-edge contact portion X, where the applied thermal stress is highest, is covered with the insulating layer 19.

In addition, since the bump 10 defining the external connection terminal is disposed in a region where the laminated film 3 is not disposed in plan view, stress is not directly applied to the laminated film 3 when the bump 10 is bonded. This configuration enables the laminated film 3, which includes the piezoelectric thin film 6, to be unlikely to crack or chip.

The principal surface of the support substrate 2 on the laminated film 3 side includes the recess 12 at the outer edge of the laminated film 3 in plan view, and the recess 12 is covered with the insulating layer 19. If expressed differently, this configuration is described in 1) and 2) as follows: 1) The recess 12 is provided in the support substrate 2 so as to include the connecting portion 2a, which is in contact with the outer-edge contact portion X described above; and 2) The insulating layer 19 extends to the outer-edge contact portion X and the connecting portion 2a. In this configuration, the acoustic wave device 1 is assumed to include the laminated film 3, and the support substrate 2 is assumed to include the removal region R1. Since the outer-edge contact portion X is covered with the insulating layer 19, the support substrate 2 and the laminated film 3 are unlikely to separate from each other, for example, when stress is applied. Further, since the insulating layer 19 extends to the region above the piezoelectric thin film 6, the movement of the laminated film 3 in a direction to separate from the support substrate 2 can be reduced or prevented. Thus, the separation between the support substrate 2 and the laminated film 3 can be efficiently be reduced or prevented.

The recess 12 preferably surrounds the laminated film 3 as in the present preferred embodiment. Since the entire or substantially the entire outer-edge contact portion X can be covered with the insulating layer 19 in this configuration, the support substrate 2 and the laminated film 3 are less likely to separate from each other.

As shown in FIG. 4, the insulating layer 19 preferably extends to the bottom of the recess 12. The area of the insulating layer 19 in contact with the connecting portion 2a can be increased in this way, and a degree of close contact between the support substrate 2 and the insulating layer 19 can be increased. Thus, the support substrate 2 and the laminated film 3 are less likely to separate from each other.

In the present preferred embodiment, an end surface of the first portion 19a of the insulating layer 19, the end surface including the portion in contact with the piezoelectric thin film 6, is inclined with respect to the thickness direction. The portion extending from the second portion 19b to the first portion 19a of the insulating layer 19 and vicinity are also inclined. The connecting electrode 17, which lies on the insulating layer 19, is also inclined in a portion extending from the region above the piezoelectric thin film 6 to the region above the insulating layer 19 and vicinity and in a portion extending from the region above the second portion 19b to the region above the first portion 19a of the insulating layer 19 and vicinity.

The portion extending from the region above the second portion 19b to the region above the first portion 19a of the insulating layer 19 is referred to as a third portion. If the third portion extends vertically, the thickness of a portion of the connecting electrode 17 disposed on the third portion tends to be thinner than the thickness of a portion of the connecting electrode 17 disposed on the first portion 19a or the second portion 19b. In contrast, since the third portion is inclined in the present preferred embodiment, the portion of the connecting electrode 17 disposed on the third portion can be thicker than the portion of the connecting electrode 17 disposed on the third portion that is not inclined. Thus, the connecting electrode 17 is unlikely to be disconnected. However, the insulating layer 19 and the connecting electrode 17 need not necessarily be inclined as described above.

The inner surface 12b of the recess 12 is preferably inclined with respect to the thickness direction of the support substrate 2 so as to approach the connecting portion 2a. In this case, the direction of the shearing stress applied to the interface between the removal region R1 of the support substrate 2 and the insulating layer 19 is not parallel to the direction in which the inner surface 12b extends. Thus, since the recess 12 including the inner surface 12b described above is provided, the effect of the above shearing stress on a portion where the support substrate 2 and the laminated film 3 are in contact with each other can be reduced or prevented. Consequently, the support substrate 2 and the laminated film 3 are less likely to separate from each other.

The inner surface 12b is more preferably connected directly to the connecting portion 2a as in the present preferred embodiment. Thus, the volume of the recess 12 can be reduced, and the surface of the insulating layer 19 on the connecting electrode side is unlikely to incline sharply. Consequently, the disconnection of the connecting electrode 17 can be reduced or prevented, and the support substrate 2 and the laminated film 3 are unlikely to separate from each other.

The connecting portion 2a of the recess 12 extends parallel or substantially parallel to the thickness direction of the support substrate 2 in the acoustic wave device 1. The connecting portion 2a may be inclined with respect to the thickness direction of the support substrate 2 as long as the connecting portion 2a extends from the outer-edge contact portion X side toward a lower portion in the removal region R1. The connecting portion 2a and the inner surface 12b may each include a curved surface. A cross section of the recess 12 shown in FIG. 4 is triangular or substantially triangular in the present preferred embodiment. The cross section of the recess 12 is not limited to the above shape and may be, for example, rectangular, trapezoidal, or fan-shaped.

If the support substrate 2 is made of a material having a high acoustic velocity in relative terms, such as Si, for example, the high-acoustic-velocity film 4 may be omitted. An advantageous effect similar to the above advantageous effect can also be obtained in such a case.

Figure 5:
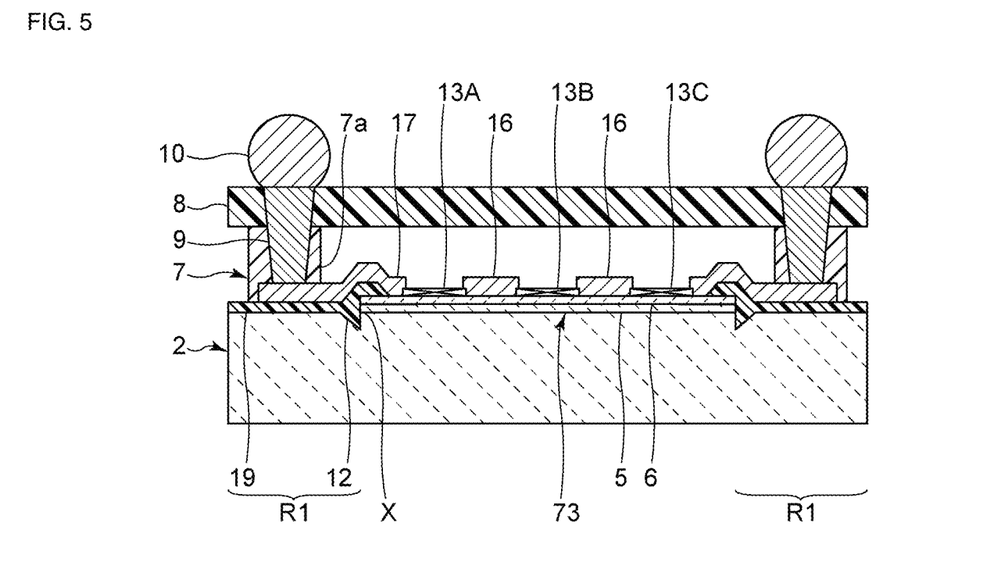
FIG. 5 is a schematic cross-sectional view of an acoustic wave device according to a modification of the first preferred embodiment of the present invention.

FIG. 5 is a schematic cross-sectional view of an acoustic wave device according to a modification of the first preferred embodiment of the present invention.

In the present modification, the support substrate 2 is made of material in which, similarly to the case of the above high-acoustic-velocity film, a bulk wave propagates at a higher acoustic velocity than the acoustic velocity of an acoustic wave that propagates in the piezoelectric thin film 6. The piezoelectric thin film 6 is disposed on the low-acoustic-velocity film 5 in a laminated film 73. The laminated film 73 does not include a high-acoustic-velocity film. In this case, the energy of the acoustic wave can also be efficiently confined, and the support substrate 2 and the laminated film 73 are unlikely to separate from each other.

Figure 6:
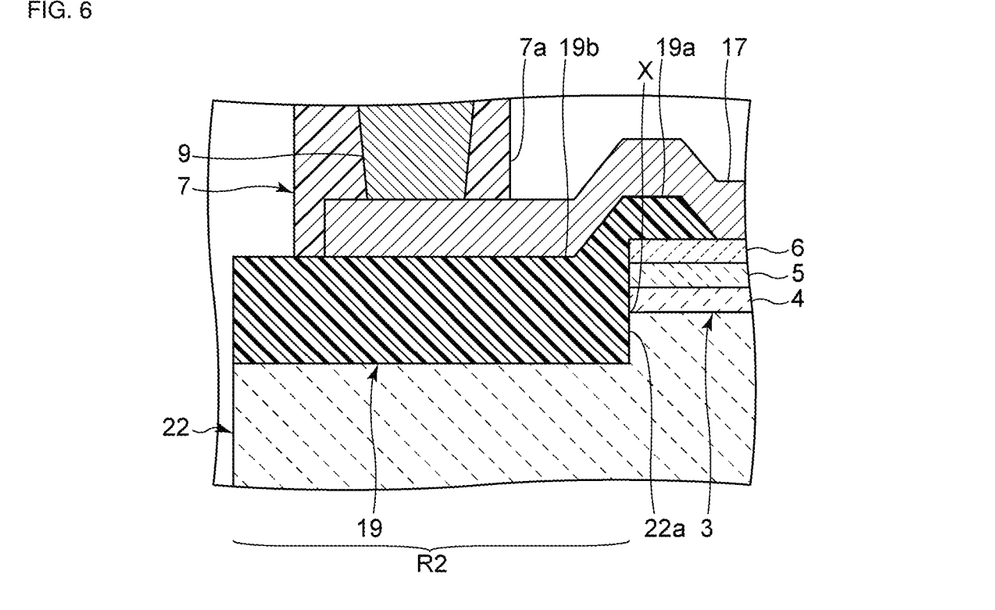
FIG. 6 is a schematic enlarged cross-sectional view of an acoustic wave device according to a second preferred embodiment of the present invention.

FIG. 6 is a schematic enlarged cross-sectional view of an acoustic wave device according to a second preferred embodiment of the present invention. FIG. 6 shows a cross section that corresponds to the cross section shown in FIG. 4, as is the case with each schematic enlarged cross-sectional view described below.

The present preferred embodiment differs from the first preferred embodiment in that the entire or substantially the entire removal region R2 is lowered and a connecting portion 22a is in contact with the entire or substantially the entire outer-edge contact portion X. The acoustic wave device according to the present preferred embodiment has a configuration similar to the configuration of the acoustic wave device 1 according to the first preferred embodiment, except the above feature.

The connecting portion 22a in the present preferred embodiment is a step portion at the boundary between a portion of a support substrate 22 and the removal region R2, the portion of the support substrate 22 being in contact with the laminated film 3. The insulating layer 19 extends to the outer-edge contact portion X and the connecting portion 22a. Thus, since the outer-edge contact portion X is covered with the insulating layer 19, the support substrate 22 and the laminated film 3 are unlikely to separate from each other in the present preferred embodiment.

If a support substrate includes a step portion and a lower portion, which is lower than the remaining portion of the support substrate, a recess of the support substrate is assumed to include the lower portion in the present specification. If the lower portion in the support substrate extends from the step portion in the support substrate to the outer edge of the support substrate, the lower portion is still assumed to be a recess. In the second preferred embodiment, which is shown in FIG. 6, a recess is provided in an entire or substantially entire region outside a region where the laminated film 3 is disposed on the support substrate 22 in plan view.

If the entire or substantially the entire removal region R2 needs to be lowered, for example, the support substrate 2 may be etched after a resist layer is provided on the laminated film 3.

Figure 7:
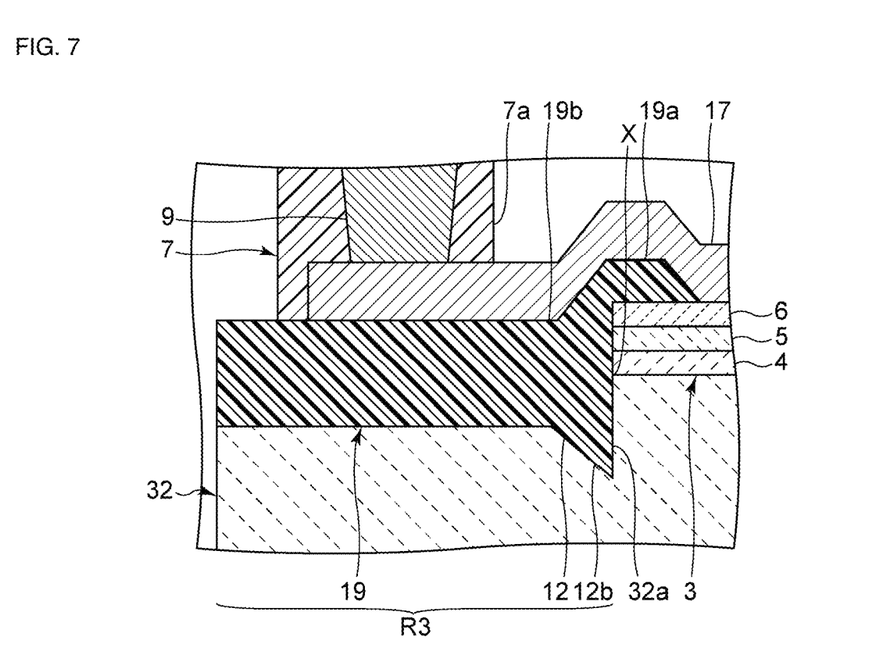
FIG. 7 is a schematic enlarged cross-sectional view of an acoustic wave device according to a third preferred embodiment of the present invention.

FIG. 7 is a schematic enlarged cross-sectional view of an acoustic wave device according to a third preferred embodiment of the present invention.

The present preferred embodiment differs from the first preferred embodiment in that a support substrate 32 includes the recess 12 and the entire or substantially the entire removal region R3 is lowered as in the second preferred embodiment. The acoustic wave device according to the present preferred embodiment has a configuration similar to the configuration of the acoustic wave device 1 according to the first preferred embodiment, except the above feature.

In the present preferred embodiment, the recess 12 includes a portion of a connecting portion 32a. The connecting portion 32a includes a portion corresponding to a surface inside the recess 12 and a portion corresponding to the step portion described above as in the second preferred embodiment. The insulating layer 19 extends to the outer-edge contact portion X and the connecting portion 32a. More specifically, the insulating layer 19 extends to the portion corresponding to the step portion described above and the portion corresponding to a surface inside the recess 12, both of which are included in the connecting portion 32a. Thus, since the outer-edge contact portion X is covered with the insulating layer 19 and a degree of close contact between the support substrate 32 and the insulating layer 19 can further be increased, the support substrate 32 and the laminated film 3 are more unlikely to separate from each other.

In the cross section shown, for example, in FIG. 7, the direction in which the portion corresponding to the step portion described above, which is included in the connecting portion 32a, extends and the direction in which the portion corresponding to a surface inside the recess 12, which is included in the connecting portion 32a, extends may differ from each other.

Figure 14:
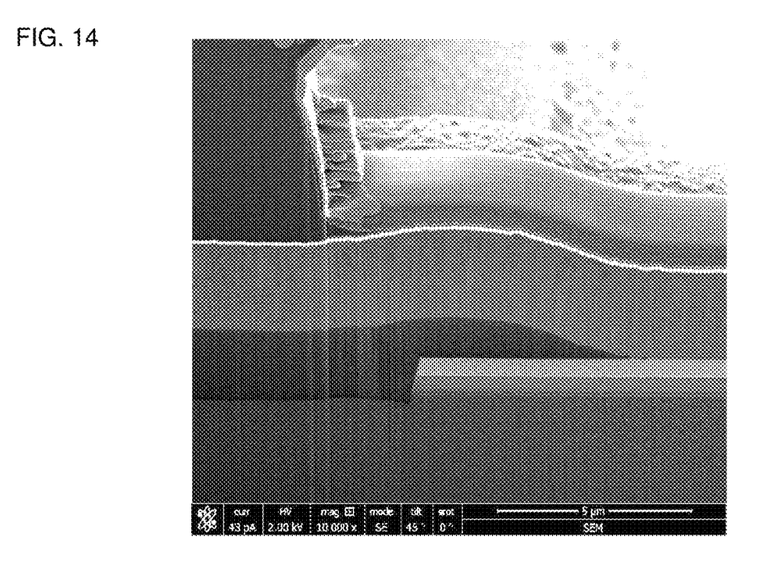
FIG. 14 is a scanning microscopic photograph showing a portion of an acoustic wave device according to the third preferred embodiment of the present invention.

A configuration of the third preferred embodiment is shown in a scanning microscopic photograph in FIG. 14. It is to be noted that an insulating layer extends to a step portion, to a surface inside a recess, and further to a region above a piezoelectric thin film.

Figure 15:
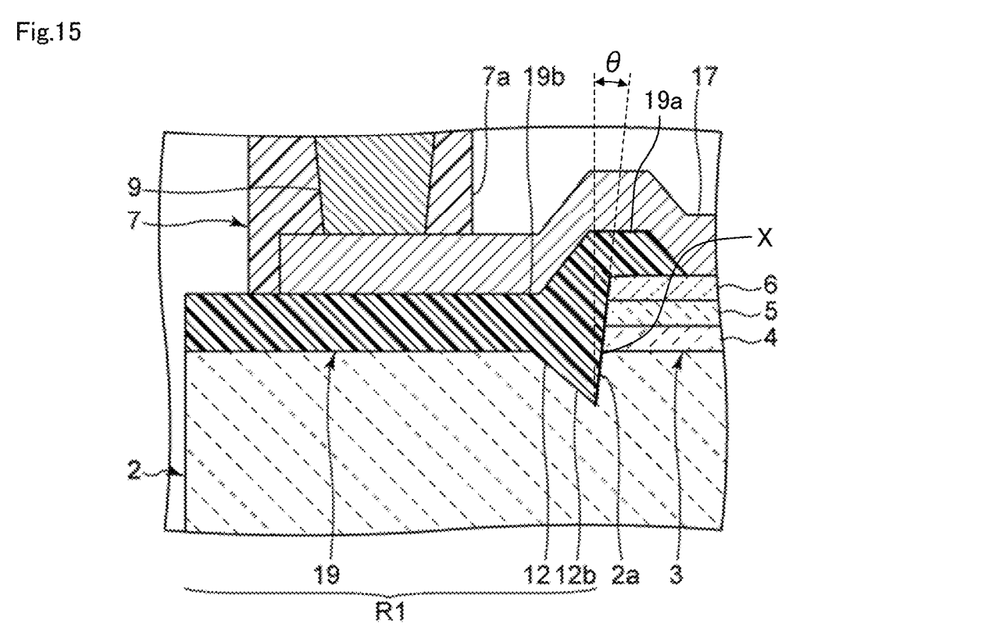
FIG. 15 is a schematic enlarged cross-sectional view of an acoustic wave device according to a preferred embodiment of the present invention.

A side surface (a surface of the laminated film extended from the connecting portion 2a) of the laminated film 3 may be inclined as shown in FIG. 15. In FIG. 15, the outer-edge contact portion X is not disposed directly above the bottom of the recess 12 and does not overlap with the bottom of the recess 12 in plan view. Denoting an angle between a line extended vertically to the support substrate 2 passing through the bottom of the recess 12 and a line extended along the side surface of the laminated film 3 as θ, for example, θ may preferably be equal to or more than about 0° and less than about 2°, θ may preferably be equal to or more than about 2° and less than about 4°, θ may preferably be equal to or more than about 4° and less than about 6°, θ may preferably be equal to or more than about 6° and less than about 8°, θ may preferably be equal to or more than about 8° and less than about 10°, θ may preferably be equal to or more than about 10° and less than about 12°, θ may preferably be equal to or more than about 12° and less than about 14°, θ may preferably be equal to or more than about 14° and less than about 16°, θ may preferably be equal to or more than about 16° and less than about 18°, θ may preferably be equal to or more than about 18° and less than about 20°, θ may preferably be equal to or more than about 20° and less than about 22°, θ may preferably be equal to or more than about 22° and less than about 24°, θ may preferably be equal to or more than about 24° and less than about 26°, θ may preferably be equal to or more than about 26° and less than about 28°, θ may preferably be equal to or more than about 28° and less than about 30°, θ may preferably be equal to or more than about 30° and less than about 32°, θ may preferably be equal to or more than about 32° and less than about 34°, θ may preferably be equal to or more than about 34° and less than about 36°, θ may preferably be equal to or more than about 36° and less than about 38°, θ may preferably be equal to or more than about 38° and less than about 40°, θ may preferably be equal to or more than about 40° and less than about 42°, θ may preferably be equal to or more than about 42° and less than about 44°, and θ may preferably be equal to or more than about 44° and less than about 46°.

Figure 8:
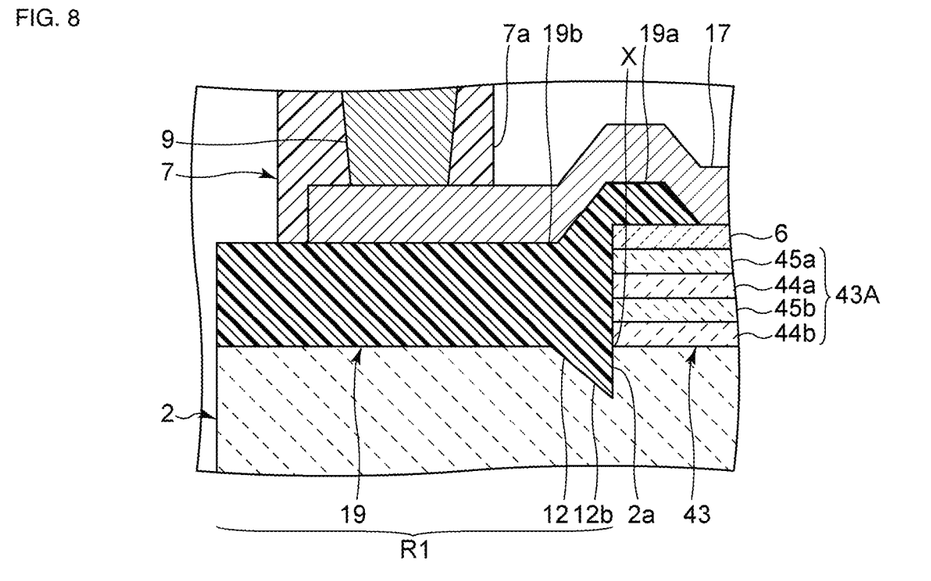
FIG. 8 is a schematic enlarged cross-sectional view of an acoustic wave device according to a fourth preferred embodiment of the present invention.

FIG. 8 is a schematic enlarged cross-sectional view of an acoustic wave device according to a fourth preferred embodiment of the present invention.

The present preferred embodiment differs from the first preferred embodiment in that a laminated film 43 includes an acoustic reflective layer 43A. The acoustic wave device according to the present preferred embodiment has a configuration similar to the configuration of the acoustic wave device 1 according to the first preferred embodiment, except the above feature.

The acoustic reflective layer 43A includes a plurality of high-acoustic-impedance films having an acoustic impedance that is high in relative terms and a plurality of low-acoustic-impedance films having a lower acoustic impedance than the acoustic impedance of the high-acoustic-impedance films. More specifically, as shown in FIG. 8, a high-acoustic-impedance film, such as a high-acoustic-impedance film 44a or 44b, and a low-acoustic-impedance film, such as a low-acoustic-impedance film 45a or 45b, are alternately laminated. The number of the high-acoustic-impedance films and the number of the low-acoustic-impedance films are not particularly limited.

The piezoelectric thin film 6 is disposed on the acoustic reflective layer 43A. Thus, the energy of an acoustic wave can be efficiently confined. In addition, since the outer-edge contact portion X is covered with the insulating layer 19, the support substrate 2 and the laminated film 43 are unlikely to separate from each other in the present preferred embodiment.

In the configuration including the laminated film 43, which includes the acoustic reflective layer 43A, the structure of the support substrate 2 and the connecting portion 2a is not limited to such a structure as is described in the first preferred embodiment either. In a first modification and a second modification of the fourth preferred embodiment, which will be described below, the support substrate and the laminated film 43 are also unlikely to separate from each other.

Figure 9:
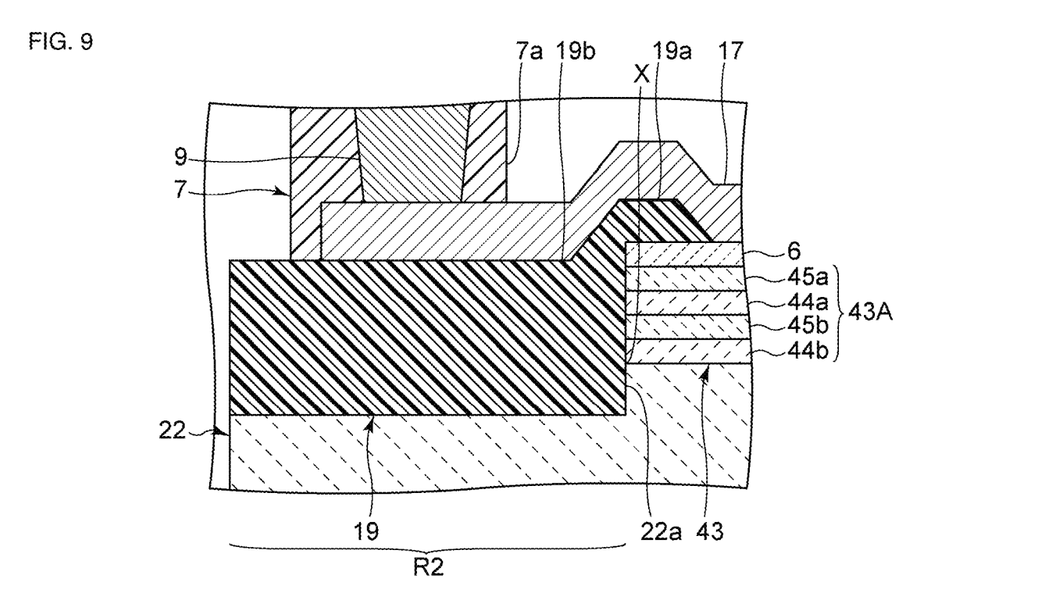
FIG. 9 is a schematic enlarged cross-sectional view of an acoustic wave device according to a first modification of the fourth preferred embodiment of the present invention.

FIG. 9 is a schematic enlarged cross-sectional view of an acoustic wave device according to the first modification of the fourth preferred embodiment.

In the support substrate 22 according to the present modification, the entire or substantially the entire removal region R2 is lowered as in the second preferred embodiment, and the connecting portion 22a is in contact with the entire or substantially the entire outer-edge contact portion X.

Figure 10:
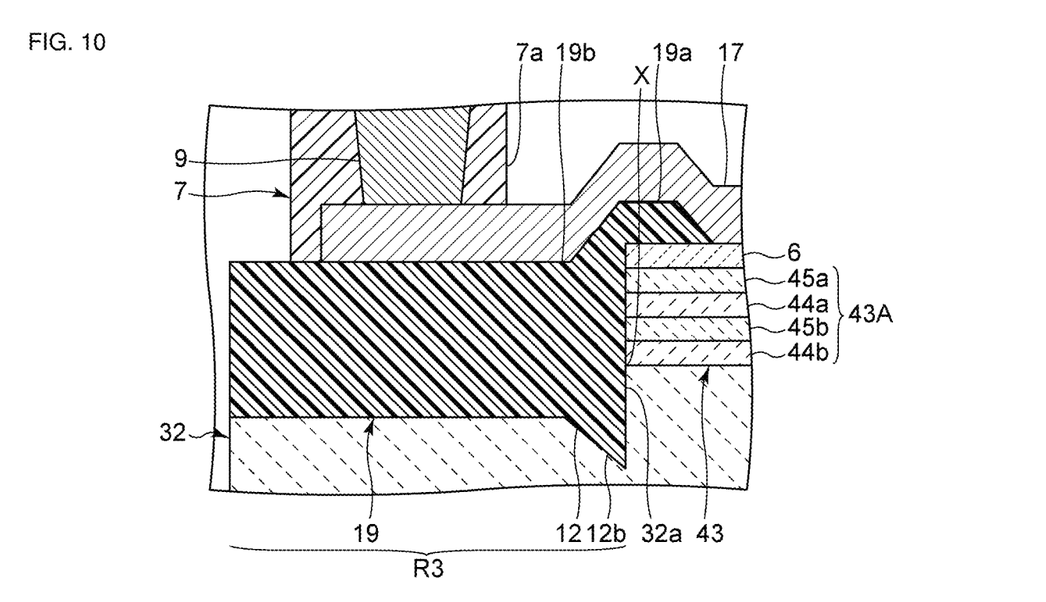
FIG. 10 is a schematic enlarged cross-sectional view of an acoustic wave device according to a second modification of the fourth preferred embodiment of the present invention.

FIG. 10 is a schematic enlarged cross-sectional view of an acoustic wave device according to the second modification of the fourth preferred embodiment.

The support substrate 32 according to the present modification includes the recess 12 as in the third preferred embodiment, and the entire or substantially the entire removal region R3 is lowered.

Figure 11:
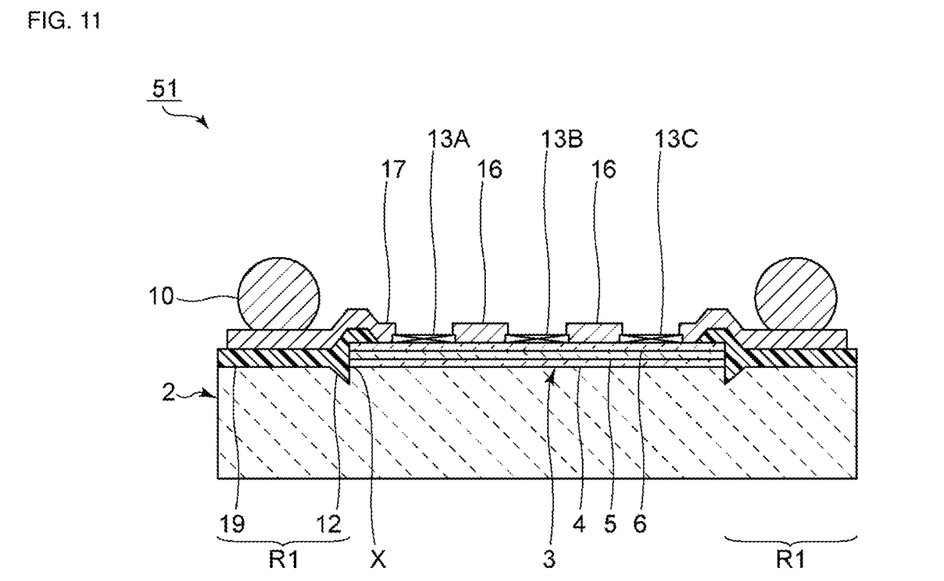
FIG. 11 is a schematic cross-sectional view of an acoustic wave device according to a fifth preferred embodiment of the present invention.

FIG. 11 is a schematic cross-sectional view of an acoustic wave device according to a fifth preferred embodiment of the present invention. FIG. 11 shows a cross section that corresponds to the cross section shown in FIG. 1, as is the case with FIG. 12, which will be described below.

An acoustic wave device 51 in the present preferred embodiment differs from the acoustic wave device 1 in the first preferred embodiment in that the bump 10 is disposed directly on the connecting electrode 17. The support substrate 2 and the laminated film 3 are unlikely to separate from each other in the present preferred embodiment as in the first preferred embodiment.

Figure 12:
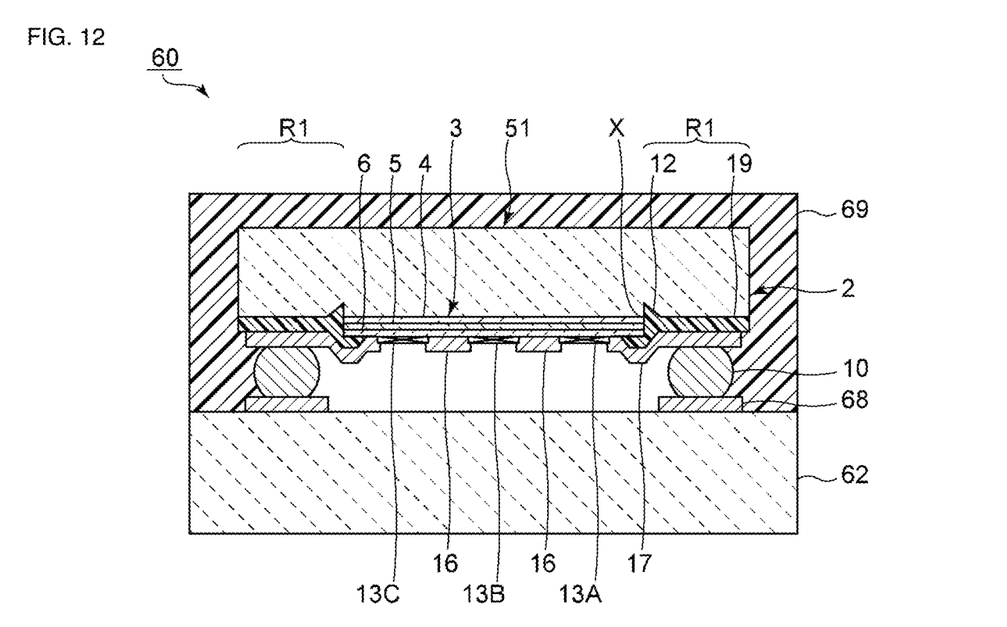
FIG. 12 is a schematic cross-sectional view of an acoustic-wave-device-packaged structure according to a sixth preferred embodiment of the present invention.

FIG. 12 is a schematic cross-sectional view of an acoustic-wave-device-packaged structure according to a sixth preferred embodiment of the present invention.

An acoustic-wave-device-packaged structure 60 includes a mounting board 62. The acoustic wave device 51 in the fifth preferred embodiment is mounted on the mounting board 62. More specifically, a plurality of connection terminals 68 are disposed on the mounting board 62. Each bump 10 of the acoustic wave device 51 is bonded to a corresponding one of the connection terminals 68. An encapsulating resin 69 is disposed on the mounting board 62 to cover the acoustic wave device 51. In this way, the acoustic wave device 51 is mounted on the mounting board 62. Thus, the acoustic-wave-device-packaged structure 60 has a CSP structure.

Since the acoustic wave device 51 in the acoustic-wave-device-packaged structure 60 has the configuration in the fifth preferred embodiment, the support substrate 2 and the laminated film 3 are unlikely to separate from each other in the present preferred embodiment.

Each of the acoustic wave devices in the above preferred embodiments may be used as a component, such as a duplexer, for example, in a radio-frequency front-end circuit. An example of the use will be described below.

Figure 13:
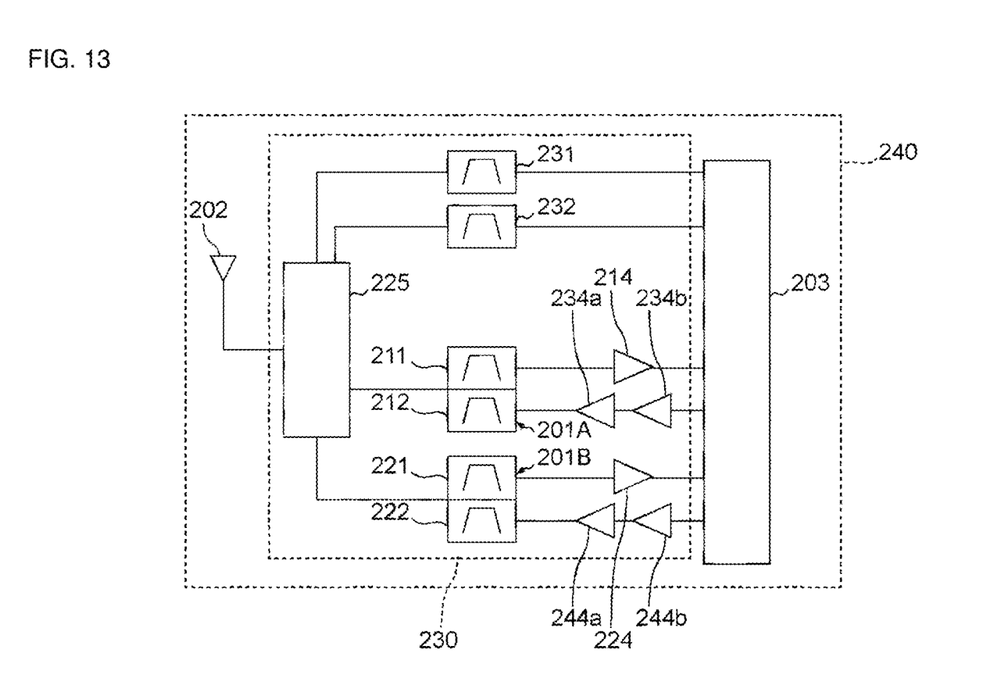
FIG. 13 is a block diagram of a communication apparatus including a radio-frequency front-end circuit according to a preferred embodiment of the present invention.

FIG. 13 is a block diagram of a communication apparatus and a radio-frequency front-end circuit according to a preferred embodiment of the present invention. Components connected to a radio-frequency front-end circuit 230, such as an antenna element 202 and a radio-frequency signal processing circuit (RFIC) 203, are also shown in FIG. 13. The radio-frequency front-end circuit 230 and the radio-frequency signal processing circuit 203 define a communication apparatus 240. The communication apparatus 240 may include a power supply, a central processing unit (CPU), and a display, for example.

The radio-frequency front-end circuit 230 includes a switch 225, duplexers 201A and 201B, filters 231 and 232, low-noise amplifier circuits 214 and 224, and power amplifier circuits 234a, 234b, 244a, and 244b. The radio-frequency front-end circuit 230 and the communication apparatus 240 in FIG. 13 are provided to illustrating a radio-frequency front-end circuit and a communication apparatus and are not intended to limit the scope of the present invention.

The duplexer 201A includes filters 211 and 212. The duplexer 201B includes filters 221 and 222. The duplexers 201A and 201B are connected to the antenna element 202 via the switch 225. Each of the acoustic wave devices described above may be adopted as the duplexer 201A or 201B or as the filter 211, 212, 221, or 222.

Further, each of the acoustic wave devices described above may also be used, for example, as a multiplexer including three or more filters, such as a triplexer in which three filters share an antenna terminal and a hexaplexer in which six filters share an antenna terminal.

Namely, examples of the acoustic wave devices described above include an acoustic wave resonator, a filter, a duplexer, and a multiplexer having three or more filters. The configuration of the multiplexer is not limited to a configuration including both a transmit filter and a receive filter and may be a configuration including only a transmit filter or only a receive filter.

The switch 225 connects the antenna element 202 to a signal path corresponding to a predetermined band in accordance with a control signal from a controller (not shown) and is preferably defined by, for example, a single-pole double-throw (SPDT) switch. The number of signal paths connected to the antenna element 202 is not limited to one and may be more than one. In other words, the radio-frequency front-end circuit 230 may be capable of carrier aggregation.

The low-noise amplifier circuit 214 is a receiving and amplifying circuit that amplifies a radio-frequency signal (a radio-frequency receive signal in this case) after the radio-frequency signal passes through the antenna element 202, the switch 225, and the duplexer 201A and that outputs the radio-frequency signal to the radio-frequency signal processing circuit 203. The low-noise amplifier circuit 224 is a receiving and amplifying circuit that amplifies a radio-frequency signal (a radio-frequency receive signal in this case) after the radio-frequency signal passes through the antenna element 202, the switch 225, and the duplexer 201B and that outputs the radio-frequency signal to the radio-frequency signal processing circuit 203.

The power amplifier circuits 234a and 234b are transmitting and amplifying circuits that amplify a radio-frequency signal (a radio-frequency transmit signal in this case), which is output from the radio-frequency signal processing circuit 203, and that output the radio-frequency signal to the antenna element 202 through the duplexer 201A and the switch 225. The power amplifier circuits 244a and 244b are transmitting and amplifying circuits that amplify a radio-frequency signal (a radio-frequency transmit signal in this case), which is output from the radio-frequency signal processing circuit 203, and that output the radio-frequency signal to the antenna element 202 through the duplexer 201B and the switch 225.

The radio-frequency signal processing circuit 203 performs signal processing, such as down-converting, for example, on a radio-frequency receive signal, which is input from the antenna element 202 through a receive signal path, and outputs a receive signal generated by the signal processing. The radio-frequency signal processing circuit 203 also performs signal processing, such as up-converting, for example, on a transmit signal, which is input, and outputs to the power amplifier circuits 234a, 234b, 244a, and 244b a radio-frequency transmit signal generated by the signal processing. The radio-frequency signal processing circuit 203 is preferably, for example, a radio-frequency integrated circuit (RFIC). The communication apparatus may include a baseband integrated circuit (BBIC). In this case, the BBIC performs signal processing on a receive signal that has been processed by the RFIC. The BBIC also performs signal processing on a transmit signal and outputs the transmit signal to the RFIC. A receive signal that has undergone the BBIC processing and a transmit signal that is to undergo the BBIC processing include an image signal and an audio signal.

The radio-frequency front-end circuit 230 may include duplexers according to modifications of the duplexers 201A and 201B, instead of the duplexers 201A and 201B described above.

In contrast, the filters 231 and 232 in the communication apparatus 240 are connected between the radio-frequency signal processing circuit 203 and the switch 225 with neither the low-noise amplifier circuits 214 and 224 nor the power amplifier circuits 234a, 234b, 244a, and 244b being interposed. Similarly to the duplexers 201A and 201B, the filters 231 and 232 are also connected to the antenna element 202 via the switch 225.

Since the radio-frequency front-end circuit 230 and the communication apparatus 240 configured as described above include acoustic wave resonators, filters, duplexers, multiplexers having three or more filters, and the like, which use acoustic wave devices according to preferred embodiments of the present invention, the support substrate and the laminated film including the piezoelectric thin film are unlikely to separate from each other, and the laminated film is unlikely to crack or chip.

The acoustic wave devices, the radio-frequency front-end circuits, and the communication apparatuses according to each of the preferred embodiments of the present invention have been described by illustrating the preferred embodiments and the modifications thereof. The present invention includes other preferred embodiments obtained through combinations of any elements in the above preferred embodiments or the above modifications, modifications obtained from the above preferred embodiments through various alterations conceived by those skilled in the art within the scope of the present invention, and various apparatuses including the radio-frequency front-end circuit and the communication apparatus according to the present invention.

Preferred embodiments of the present invention are widely applicable to communication apparatuses, such as cellular phones, for example, as an acoustic wave resonator, a filter, a duplexer, a multiplexer applicable to a multiband system, a front-end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a laminated film disposed on the support substrate and inside at least a portion of an outer edge of the support substrate in plan view and including a piezoelectric thin film;
   an interdigital transducer (IDT) electrode disposed on the laminated film;
   an insulating layer disposed on the support substrate and on the laminated film and extending from a region above the support substrate to a region above the laminated film;
   a connecting electrode disposed on the insulating layer and electrically connected to the IDT electrode; and
   an external connection terminal electrically connected to the connecting electrode and disposed directly on or indirectly above the connecting electrode and in plan view outside a region where the laminated film is disposed on the support substrate; wherein
   a principal surface of the support substrate on a side of the laminated film includes a recess at an outer edge of the laminated film in plan view; and
   the recess is covered with the insulating layer.

2. The acoustic wave device according to claim 1, wherein a coefficient of linear expansion of the laminated film and a coefficient of linear expansion of the support substrate differ from each other.

3. The acoustic wave device according to claim 1, wherein the recess is provided in an entire or substantially an entire region outside the region where the laminated film is disposed on the support substrate in plan view.

4. The acoustic wave device according to claim 1, wherein the recess surrounds the laminated film.

5. The acoustic wave device according to claim 1, wherein
   the support substrate is made of material in which a bulk wave propagates at a higher acoustic velocity than an acoustic velocity of an acoustic wave that propagates in the piezoelectric thin film;
   the laminated film includes a low-acoustic-velocity film in which a bulk wave propagates at a lower acoustic velocity than the acoustic velocity of the acoustic wave that propagates in the piezoelectric thin film; and
   the piezoelectric thin film is disposed on the low-acoustic-velocity film.

6. The acoustic wave device according to claim 1, wherein
   the laminated film includes a high-acoustic-velocity film in which a bulk wave propagates at a higher acoustic velocity than an acoustic velocity of an acoustic wave that propagates in the piezoelectric thin film and a low-acoustic-velocity film in which a bulk wave propagates at a lower acoustic velocity than the acoustic velocity of the acoustic wave that propagates in the piezoelectric thin film;
   the low-acoustic-velocity film is disposed on the high-acoustic-velocity film; and
   the piezoelectric thin film is disposed on the low-acoustic-velocity film.

7. The acoustic wave device according to claim 1, wherein
   the laminated film includes an acoustic reflective layer that includes a high-acoustic-impedance film having an acoustic impedance that is relatively high and a low-acoustic-impedance film having a lower acoustic impedance than the acoustic impedance of the high-acoustic-impedance film; and
   the piezoelectric thin film is disposed on the acoustic reflective layer.

8. The acoustic wave device according to claim 1, further comprising:
   a support including an opening surrounding the IDT electrode and disposed directly on or indirectly above the support substrate and in plan view in a region outside the region where the laminated film is disposed on the support substrate;
   a cover disposed on the support so as to cover the opening; and
   an under-bump metal layer that penetrates the support and the cover so as to be connected to the connecting electrode; wherein
   the external connection terminal is a bump disposed indirectly above the connecting electrode with the under-bump metal layer interposed between the connecting electrode and the external connection terminal; and
   the IDT electrode is disposed inside a hollow space enclosed by the support substrate, the support, and the cover.

9. The acoustic wave device according to claim 1, wherein the external connection terminal is a bump disposed directly on the connecting electrode.

10. A radio-frequency front-end circuit comprising:
    the acoustic wave device according to claim 1; and
    a power amplifier.

11. The radio-frequency front-end circuit according to claim 10, wherein a coefficient of linear expansion of the laminated film and a coefficient of linear expansion of the support substrate differ from each other.

12. The radio-frequency front-end circuit according to claim 10, wherein the recess is provided in an entire or substantially an entire region outside the region where the laminated film is disposed on the support substrate in plan view.

13. The radio-frequency front-end circuit according to claim 10, wherein the recess surrounds the laminated film.

14. The radio-frequency front-end circuit according to claim 10, wherein
    the support substrate is made of material in which a bulk wave propagates at a higher acoustic velocity than an acoustic velocity of an acoustic wave that propagates in the piezoelectric thin film;
    the laminated film includes a low-acoustic-velocity film in which a bulk wave propagates at a lower acoustic velocity than the acoustic velocity of the acoustic wave that propagates in the piezoelectric thin film; and
    the piezoelectric thin film is disposed on the low-acoustic-velocity film.

15. The radio-frequency front-end circuit according to claim 10, wherein the laminated film includes a high-acoustic-velocity film in which a bulk wave propagates at a higher acoustic velocity than an acoustic velocity of an acoustic wave that propagates in the piezoelectric thin film and a low-acoustic-velocity film in which a bulk wave propagates at a lower acoustic velocity than the acoustic velocity of the acoustic wave that propagates in the piezoelectric thin film;

the low-acoustic-velocity film is disposed on the high-acoustic-velocity film; and the piezoelectric thin film is disposed on the low-acoustic-velocity film.

16. The radio-frequency front-end circuit according to claim 10, wherein the laminated film includes an acoustic reflective layer that includes a high-acoustic-impedance film having an acoustic impedance that is relatively high and a low-acoustic-impedance film having a lower acoustic impedance than the acoustic impedance of the high-acoustic-impedance film; and the piezoelectric thin film is disposed on the acoustic reflective layer.

17. The radio-frequency front-end circuit according to claim 10, further comprising:

a support including an opening surrounding the IDT electrode and disposed directly on or indirectly above the support substrate and in plan view in a region outside the region where the laminated film is disposed on the support substrate;

a cover disposed on the support so as to cover the opening; and an under-bump metal layer that penetrates the support and the cover so as to be connected to the connecting electrode; wherein the external connection terminal is a bump disposed indirectly above the connecting electrode with the under-bump metal layer interposed between the connecting electrode and the external connection terminal; and the IDT electrode is disposed inside a hollow space enclosed by the support substrate, the support, and the cover.

18. The radio-frequency front-end circuit according to claim 10, wherein the external connection terminal is a bump disposed directly on the connecting electrode.

19. A communication apparatus comprising:

the radio-frequency front-end circuit according to claim 10; and a radio-frequency signal processing circuit.

\* \* \* \* \*